United States Patent
Konrath et al.

(10) Patent No.: US 9,548,399 B2
(45) Date of Patent: Jan. 17, 2017

(54) JUNCTION FIELD EFFECT TRANSISTOR CELL WITH LATERAL CHANNEL REGION

(71) Applicant: Infineon Technologies AG, Neubiberg (DE)

(72) Inventors: Jens Peter Konrath, Villach (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 23 days.

(21) Appl. No.: 14/082,815

(22) Filed: Nov. 18, 2013

(65) Prior Publication Data

US 2015/0137142 A1   May 21, 2015

(51) Int. Cl.
*H01L 31/0312* (2006.01)
*H01L 29/808* (2006.01)
*H01L 29/66* (2006.01)

(52) U.S. Cl.
CPC ....... *H01L 29/808* (2013.01); *H01L 29/66909* (2013.01); *H01L 29/8083* (2013.01)

(58) Field of Classification Search
CPC ............. H01L 29/8083; H01L 29/0634; H01L 29/8086
See application file for complete search history.

(56) References Cited

U.S. PATENT DOCUMENTS

| | | | |
|---|---|---|---|
| 2002/0167011 A1* | 11/2002 | Kumar et al. | 257/77 |
| 2005/0173726 A1* | 8/2005 | Potts | H01L 29/0692 257/134 |
| 2005/0230715 A1* | 10/2005 | Hoshino | H01L 29/0634 257/263 |
| 2006/0255373 A1* | 11/2006 | Elpelt et al. | 257/256 |
| 2008/0012026 A1* | 1/2008 | Tsuji | H01L 21/047 257/77 |
| 2011/0101501 A1 | 5/2011 | Schulze | |
| 2011/0156223 A1 | 6/2011 | Camillo-Castillo et al. | |

FOREIGN PATENT DOCUMENTS

JP    2000269518 A    9/2000

* cited by examiner

*Primary Examiner* — Thao X Le
*Assistant Examiner* — Laura Dykes
(74) *Attorney, Agent, or Firm* — Murphy, Bilak & Homiller, PLLC

(57) ABSTRACT

A semiconductor device includes a junction field effect transistor cell with a top gate region, a lateral channel region and a buried gate region. The lateral channel region is arranged between the top gate region and the buried gate region along a vertical direction with respect to a first surface of a semiconductor body. The lateral channel region comprises at least two first zones of a first conductivity type and at least one second zone of a second conductivity type, wherein the first and second zones alternate along the vertical direction. The embodiments provide well-defined channel widths and facilitate the adjustment of pinch-off voltages as well as the manufacture of normally-off junction field effect transistor cells.

11 Claims, 12 Drawing Sheets

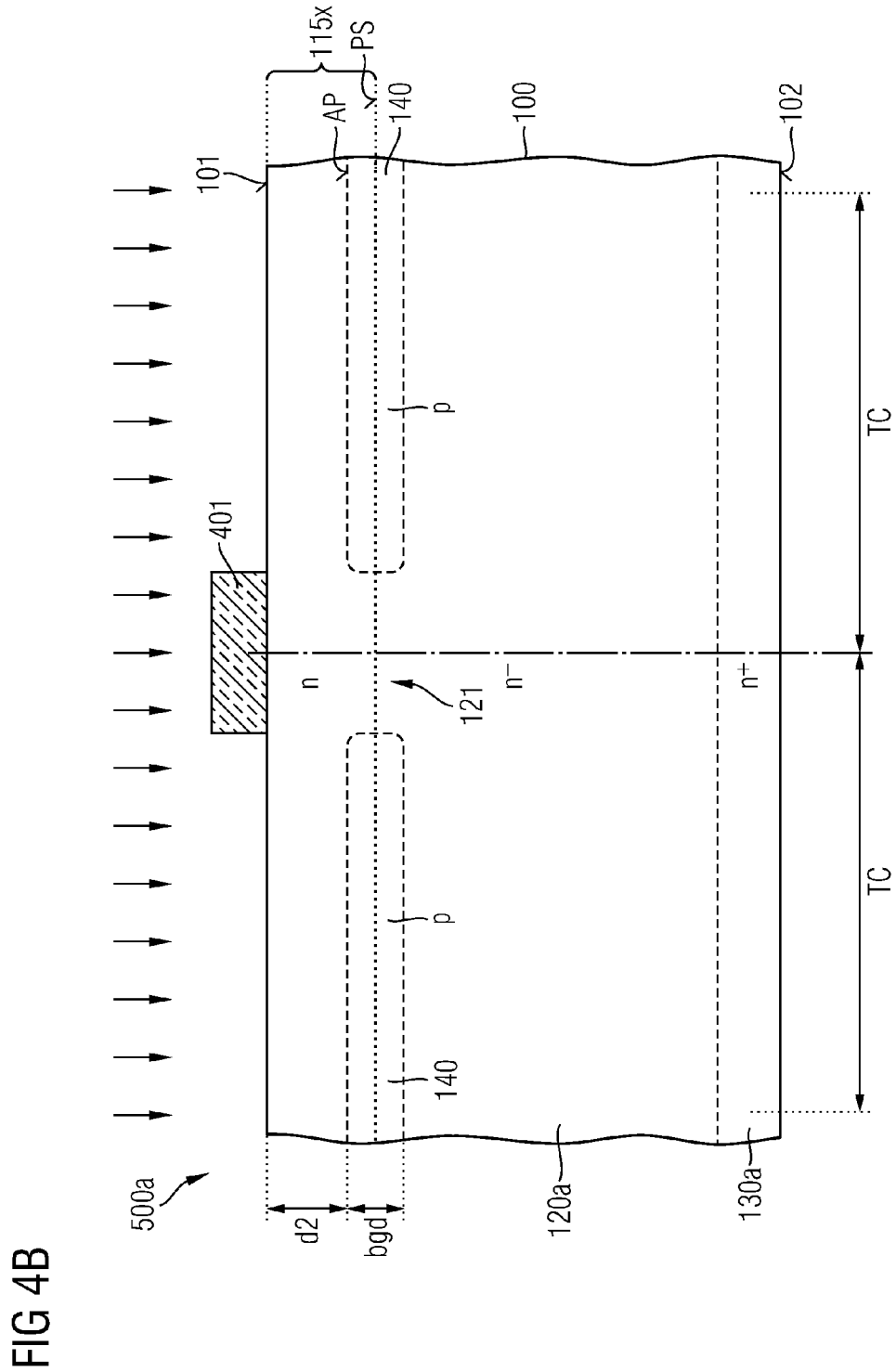

JUNCTION FIELD EFFECT TRANSISTOR CELL WITH LATERAL CHANNEL REGION

BACKGROUND

In conventional JFETs (junction field effect transistors) the extension of a depletion region of a reverse-biased pn-junction modulates the cross-sectional area of a channel region through which a load current of the JFET passes. Minority charge carrier storage effects influence the operation of JFETs only to a low degree such that JFETs can be used inter alia in high speed applications. It is desirable to provide JFETs with improved device characteristics.

SUMMARY

An embodiment refers to a semiconductor device with a junction field effect transistor cell. The junction field effect transistor cell includes a top gate region, a lateral channel region and a buried gate region. The lateral channel region is arranged between the top gate region and the buried gate region along a vertical direction with respect to a first surface of a semiconductor body. The lateral channel region comprises at least two first zones of a first conductivity type and at least one second zone of a second conductivity type, wherein the first and second zones alternate along the vertical direction.

Another embodiment relates to a junction field effect transistor that includes a top gate region, a lateral channel region and a buried gate region arranged in a semiconductor body along a vertical direction with respect to a first surface of the semiconductor body. The lateral channel region comprises at least two first zones of a first conductivity type and at least one second zone of a second conductivity type, wherein the first and second zones alternate along the vertical direction.

A further embodiment concerns a method of manufacturing a semiconductor device. Impurities are implanted to form at least one buried gate region of a second conductivity type in a first section of a first surface of a semiconductor body including a first epitaxial layer of a first conductivity type and a channel layer of the first conductivity type disposed on the first epitaxial layer. Impurities of the second conductivity type are implanted between the first surface and the at least one buried gate region to form a top gate region.

Another embodiment relates to a junction field effect transistor with a transistor cell including a top gate region, a lateral channel region and a buried gate region. The lateral channel region is arranged between the top gate region and the buried gate region along a vertical direction with respect to a first surface of a semiconductor body. A vertical impurity profile of the semiconductor body includes a first peak portion around a first concentration maximum within the top gate region and a Gaussian-shaped second peak portion around a second concentration maximum within the buried gate region. The first and second portions overcompensate a complementary background impurity concentration in the top and buried gate regions and do not overcompensate the background impurity concentration in the lateral channel region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 4B is a schematic cross-sectional view of the semiconductor substrate portion of FIG. 4A after forming buried gate structures.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having," "containing," "including," "comprising" and the like are open, and the terms indicate the presence of stated structures, elements or features but do not preclude additional elements or features. The articles "a," "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
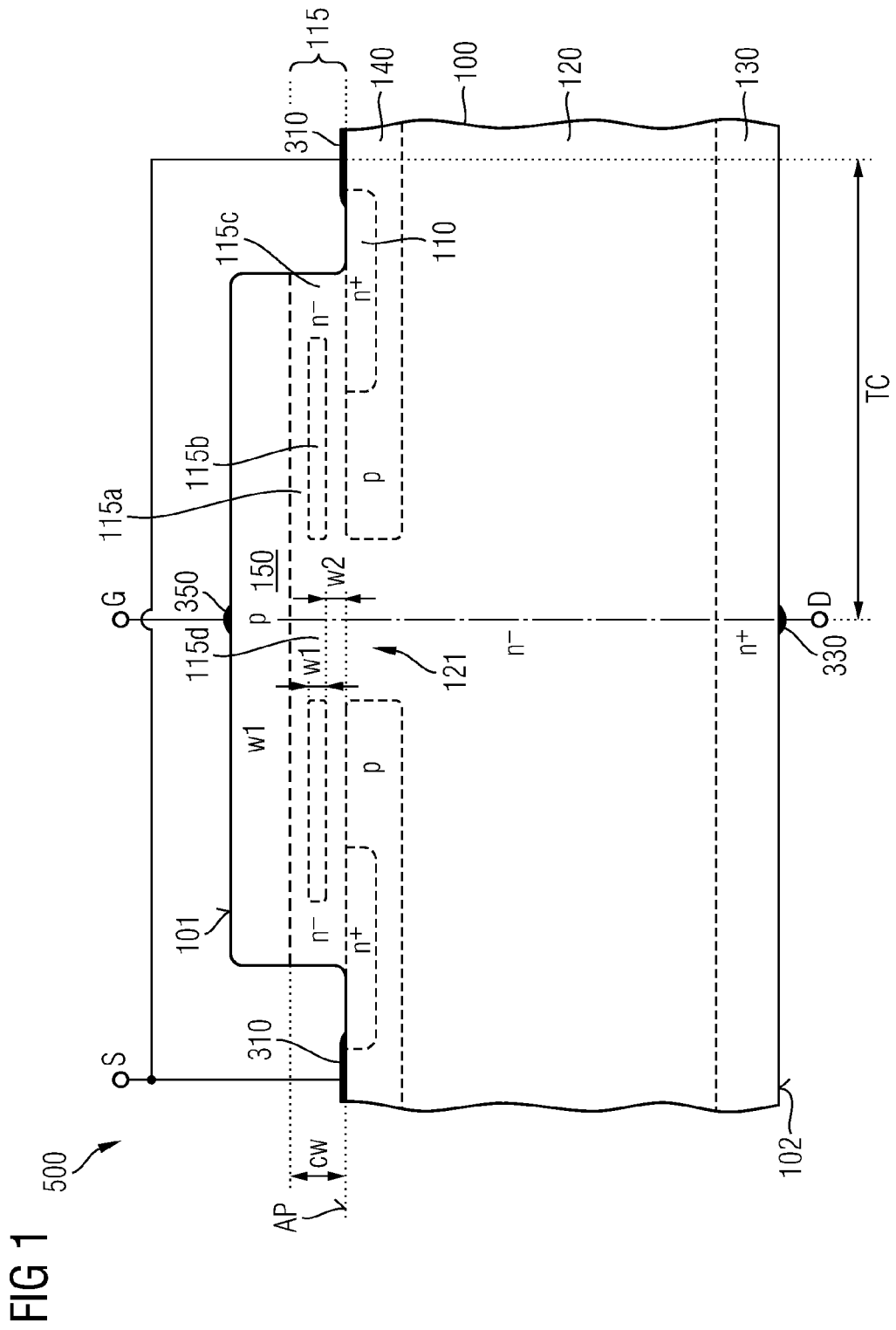
FIG. 1 is a schematic cross-sectional view of a portion of a semiconductor device including a JFET cell according to an embodiment providing a lateral channel region with horizontal pn junctions and source regions below the lateral channel region.

FIG. 1 refers to a semiconductor device 500 including at least one JFET cell TC. The semiconductor device 500 may be a JFET with a plurality of JFET cells TC and source, gate and drain terminals S, G, D or a device including further semiconductor elements in addition to one or more of the JFET cells TC.

The semiconductor device 500 is based on a semiconductor body 100 made of a single-crystalline semiconductor material having a band gap of 2.0 eV or higher, such as gallium nitride (GaN) or silicon carbide (SiC). For example, the single-crystalline semiconductor material is silicon carbide (SiC), for example 2H—SiC (SiC of the 2H polytype), 4H—SiC, 6H—SiC or 15R—SiC, by way of example.

The semiconductor body 100 has a first surface 101, which may be approximately planar or which may be given by a plane spanned by coplanar surface sections as well as a mainly planar second surface 102 parallel to the first surface 101. A normal to the first surface 101 defines a vertical direction and directions orthogonal to the vertical direction are lateral directions.

The semiconductor body 100 includes a drift zone 120 and a drain layer 130 of a first conductivity type, respectively. The drain layer 130 directly adjoins the second surface 102 and separates the drift zone 120 from the second surface 102. A mean net impurity concentration in the drain layer 130 exceeds at least ten times the mean net impurity concentration in the drift zone 120. The drift zone 120 may be formed in an epitaxial layer whose crystal lattice is grown in registry with the crystal lattice of the drain layer 130. The drift zone 120 may be in-situ doped and may have a uniform impurity distribution or an impurity concentration gradually or in steps increasing or decreasing with increasing distance to the first surface 101.

For each JFET cell TC, a buried gate region 140 of a second conductivity type that is complementary to the first conductivity type directly adjoins the drift zone 120 at a side of the drift zone 120 opposite to the drain layer 130. An interface between the buried gate region 140 and the drift zone 120 may be parallel to the first and second surfaces 101, 102.

The buried gate regions 140 may be wells formed by masked implants into the epitaxial layer with the drift zone 120 in combination with suitable annealing and diffusing processes, wherein the wells extend from an auxiliary plane AP, which is parallel to the first and second surfaces 101, 102, into the direction of the second surface 102.

A remaining portion of the drift zone 120 along the auxiliary plane AP between neighboring buried gate regions 140 forms a vertical channel region 121 extending between the auxiliary plane AP and a main portion of the drift zone 120 below the buried gate regions 140. The impurity distribution in the drift zone 120 including the vertical channel region 121 is similar or equal to the original in-situ impurity distribution of the grown epitaxial layer.

A top gate region 150 in the semiconductor body 100 has the second conductivity type and directly adjoins the first surface 101. A lateral channel region 115 is sandwiched between the top gate region 150 on the one side and the buried gate region 140 on the other side. The lateral channel region 115 as well as the top gate regions 150 may be formed in one or more epitaxial layers grown on the auxiliary plane AP before or after formation of the buried gate regions 140. The top gate and channel regions 150, 115 may form mesas protruding from the auxiliary plane AP.

The top gate region 150, the lateral channel region 115 and the buried gate regions 140 are arranged in this order along the vertical direction.

The JFET cell TC further includes a source region 110 of the first conductivity type. The source region 110 directly adjoins the lateral channel region 115. According to the illustrated embodiment, the source region 110 is formed as a well extending from the auxiliary plane AP into the buried gate regions 140.

A source electrode 310 directly adjoins the source regions 110 and provides an ohmic contact with the semiconductor body 100. The source electrode 310 is electrically connected with the source regions 110 and may be electrically connected with the buried gate regions 140 to realize an integrated body or free-wheeling diode. The source electrode 310 may provide or may be electrically connected or coupled to a source terminal S of the semiconductor device 500.

A drain electrode 330 directly adjoins the drain layer 130 and provides an ohmic contact with the drain layer 130 at the second surface 102. The drain electrode 330 may provide or may be electrically connected to a drain terminal D.

A gate electrode 350 directly adjoins the top gate region 150 and provides an ohmic contact with the top gate region 150. The gate electrode 350 may form or may be electrically coupled or connected to a gate terminal G.

Lateral cross-sections of the JFET cells TC parallel to the first surface 101, and/or the lateral cross-sections of the top gate region 150 and/or the lateral and vertical channel regions 115, 121 may be stripes, circles, ellipses, polygons, for example hexagons or rectangles, with or without rounded corners. A plurality of approximately identical JFET cells TC may be arranged at uniform center-to-center distances (pitches) and may be electrically arranged in parallel.

JFET cells TC adjoining each other may have the same lateral orientation. According to the illustrated embodiment, the JFET cells TC are arranged in pairs of two JFET cells TC which are oriented mirror-inverted with respect to a vertical symmetry plane.

In the on-state of the JFET cells TC, a load current is controlled by a potential at the top gate region 150 and flows between the source regions 110 and the drain layer 130 along the lateral direction in the lateral channel region 115 and in substance along the vertical direction in the vertical channel region 121 and the drift zone 120.

The lateral channel region 115 includes a super junction structure (compensation structure) including first zones 115$a$ of the first conductivity type and second zones 115$b$ of the second conductivity type. The first and second zones 115$a$, 115$b$ are arranged between the top gate region 150 and the auxiliary plane AP, respectively. One of the first zones 115$a$ directly adjoins the top gate region 150 and forms pn junctions substantially parallel to a lateral current flow in the lateral channel region 115. Another one of the first zones 115$a$ directly adjoins the buried gate regions 140.

The lateral channel region 115 includes at least one, for example two, second zones 115$b$ of the second conductivity type. Each second zone 115$b$ forms horizontal pn junctions with first zones 115$a$, wherein the horizontal pn junctions extend parallel to the lateral directions.

In the illustrated embodiment, one contiguous second zone 115$b$ is arranged between the top gate region 150 on the one side and the buried gate region 140 and the vertical channel region 121 on the other side. According to other embodiments, the lateral channel region 115 may include two or more parallel second zones 115$b$. Further embodiments may provide, more than one, for example two, coplanar second zones 115$b$ at the same distance to the first surface 101 and separated by a region of the opposite conductivity type, respectively.

A vertical extension cw of the lateral channel region 115 may be in the range from 100 nm to 5 µm, for example from 300 nm to 1.5 µm. A vertical center-to-center distance (pitch) between the first zones 115$a$ may be in the range from 30 nm to 500 nm, for example from 50 nm to 350 nm. A ratio of a width w1 of the first zones 115$a$ to a width w2 of the second zones 115$b$ may be in the range from 0.25 to 4, for example from 0.5 to 2. A mean impurity concentration in the first zones 115$a$ may be in the range from $5 \times 10^{15}$ cm$^{-3}$ to $1 \times 10^{17}$ cm$^{-3}$ at channel widths cw from 300 nm to 1.5 µm and in the range from $1 \times 10^{16}$ cm$^{-3}$ to $3 \times 10^{16}$ cm$^{-3}$ at channel widths cw from 500 nm to 1.0 µm, by way of example.

The widths of the first and second zones 115$a$, 115$b$ depend on the semiconductor material and the mean net impurity concentrations and are subject to whether the JFET cell TC is of the normally-on or normally-off type. According to embodiments referring to silicon carbide devices and a mean net impurity concentration in the p-type second zones 115$b$ of about 1E19 cm$^{-3}$, the mean net impurity concentration in the n-type first zones 115$a$ may be between 1E16 cm$^{-3}$ and 1E18 cm$^{-3}$. For example, wherein for a mean net impurity concentration in the n-type first zones 115$a$ of 1E16 cm$^{-3}$, the width w1 of the first zones 115$a$ may be greater 9.5 µm for normally-on devices and at most 8.5 µm for normally-off devices, whereas at a mean net impurity concentration in the first zones 115$a$ of 1E18 cm$^3$ the width w1 of the first zones 115$a$ may be equal to or greater than 90 nm for normally-on and at most 85 nm for normally-off devices. The net impurity concentrations in the top and buried gate regions 150, 140 may be approximately the same as in the p-type second zones 115$b$.

In each JFET cell TC, the lateral channel region 115 may include one, two, or more first connection zones 115$c$ of the conductivity type of the source zone 110 in the vertical projection of the source region 110. The first connection zones 115$c$ may be formed along the whole extension of the mesa sidewall or only in one or more spatially separated sections of the respective mesa sidewall. In the case of a stripe-shaped transistor cell TC, one first connection zone 115$c$ may be formed along the whole lateral extension of the JFET cell TC in a longitudinal direction perpendicular to the cross-sectional plane.

In each JFET cell TC, the lateral channel region 115 may further include one, two, or more second connection zones 115$d$ of the conductivity type of the vertical channel region 121 in the vertical projection of the vertical channel region 121. The second connection zones 115$d$ may be formed along the whole extension of the vertical channel region 121 or only in one or more spatially separated sections of the respective vertical channel region 121. In the case of a stripe-shaped transistor cell TC, one second connection zone 115$d$ may be formed along the whole lateral extension of the JFET cell TC in the longitudinal direction perpendicular to the cross-sectional plane.

For the following considerations, the first conductivity type is n-type and the second conductivity type is p-type. Similar considerations apply for embodiments with a first conductivity type being p-type and the second conductivity type being n-type.

Both the top gate regions 150 and the buried gate regions 140 are formed by implanting impurities through the first surface 101. A channel width cw between the buried edge of the top gate region 150 and the auxiliary plane AP as well as the impurity concentration in the lateral channel region 115 set the pinch-off voltage at which the JFET cell TC changes from the conductive mode or on-state to the non-conductive mode or off-state. In conventional JFET cells, the vertical extension of the lateral channel regions 115 is a function of a growth rate of an epitaxial layer in which the lateral channel region 115 is formed after the buried gate region 140 has been formed by implants. The epitaxial growth rate has turned out to be difficult to control. As a consequence, the pinch-off voltages among devices obtained from different wafers of a wafer lot show fluctuations.

By defining the channel width cw only by the difference between two well-controllable implant energies, the pinch-off voltage of the JFET cell TC is no longer subject to variations of the epitaxial growth rate.

The implant energy for the buried gate region 140 may be selected such that the interface between the lateral channel region 115 and the buried gate regions 140 is within the epitaxial channel layer even at the lower limit of the epitaxial growth rate. As a consequence, JFET cells TC with low fluctuations of the pinch-off voltage within the same wafer lot and among a plurality of wafer lots can be obtained and overall yield can be increased.

At a given impurity concentration in the lateral channel region 115, the pinch-off voltage depends on the channel width cw. For a low pinch-off voltage of normally-off JFET cells TC, the channel width cw may be comparatively small, e.g., about 200 nm for impurity concentrations greater than 5E16 cm$^{-3}$. For impurity concentrations in the channel layer 115 below 5E16 cm$^{-3}$ the channel width w may be even greater than 1 µm.

In the case of floating second zones 115b, the lateral channel splits into two or more parallel sub-channels that are consecutively pinched-off with increasing gate voltage, analogously to a floating field ringjunction termination that includes several p-type zones embedded in an n-type region. The compensation structure in the lateral channel region 115 virtually increases the thickness of the buried gate region 140 and precisely defines an effective channel width. The implementation of these p-type compensation layers enables a significant enhancement of the doping concentration of the surrounding n-type first zones and with it a drastic reduction of the resulting channel resistance.

Widths of the n-type first zones 115a greater than the extension of the depletion zones extending from the adjoining pn junctions into the respective n-type first zone 115a without any potential applied to the top gate region 150 result in a normally-on JFET cell TC.

Widths of the n-type first zones 115a equal to or smaller than the extension of the depletion zones along the pn junctions between adjoining first and second zones 115a, 115b without any potential applied to the top gate region 150 result in a normally-off JFET cell TC.

According to an embodiment, the semiconductor body 100 is based on silicon carbide, wherein the extremely low diffusion coefficient of impurities in the silicon carbide restricts a vertical extension of the implanted layers.

Figure 2:
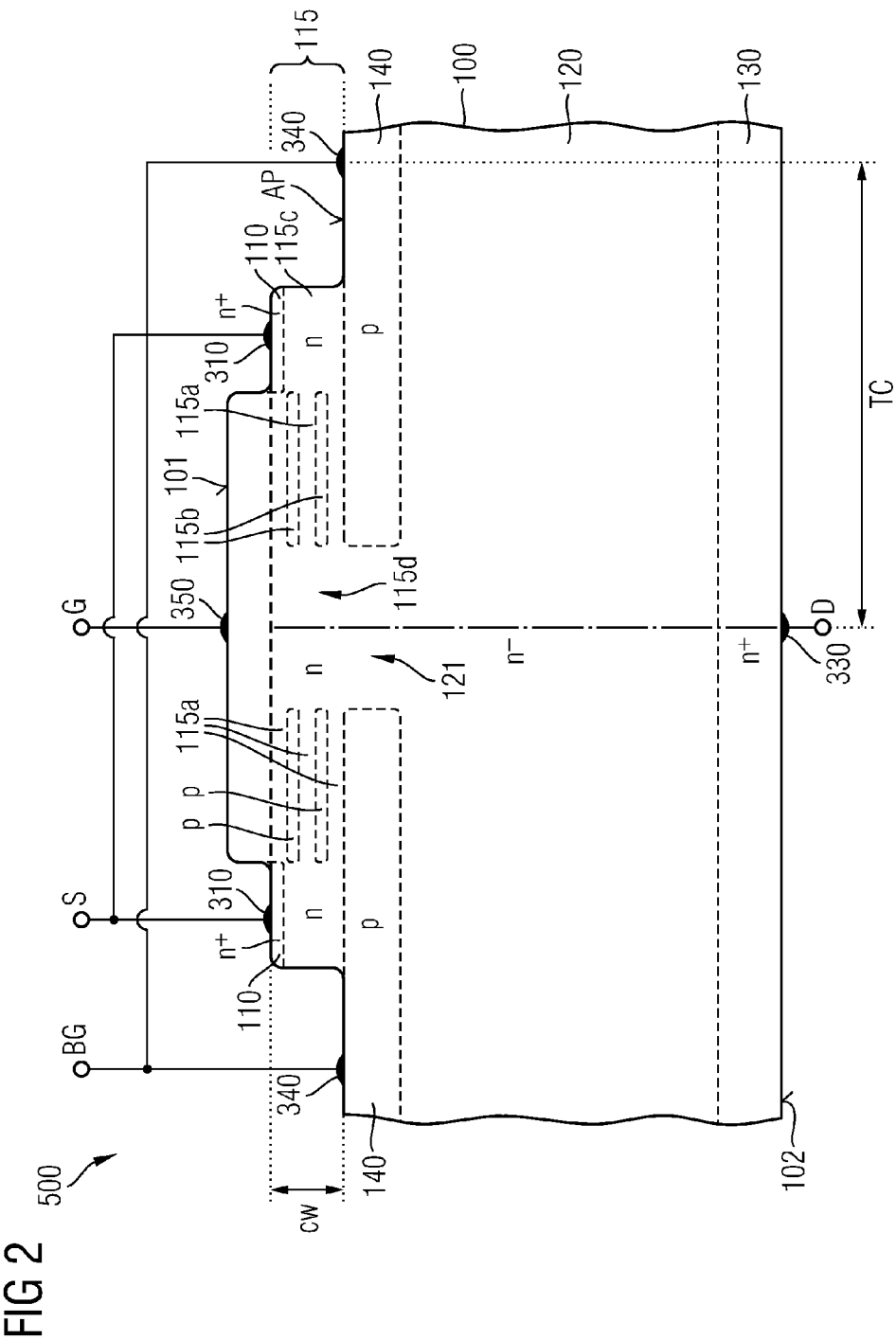
FIG. 2 is a schematic cross-sectional view of a portion of a semiconductor device including a JFET cell in accordance with an embodiment providing six horizontal pn junctions in a lateral channel region and source zones above the lateral channel region.

FIG. 2 refers to an embodiment with the source regions 110 formed at the side of the lateral channel region 115 oriented to the top gate region 150. The source regions 110 may be formed by an implant in a layer that includes the top gate region 150 and/or the lateral channel region 115 in combination with suitable anneal and diffusion processes. A second gate electrode 340 may directly adjoin to and form an ohmic contact with the buried gate regions 140. The second gate electrode 340 may be electrically coupled or connected to a second gate terminal BG, to the source electrode 310 or to another electronic element of the semiconductor device 500. The source region 110 may be formed before, during or after formation of the super junction structure in the lateral channel region 115.

Each JFET cell TC includes two floating second zones 115b, which may be evenly spaced from each other and from the top and buried gate regions 150, 140.

Figure 3:
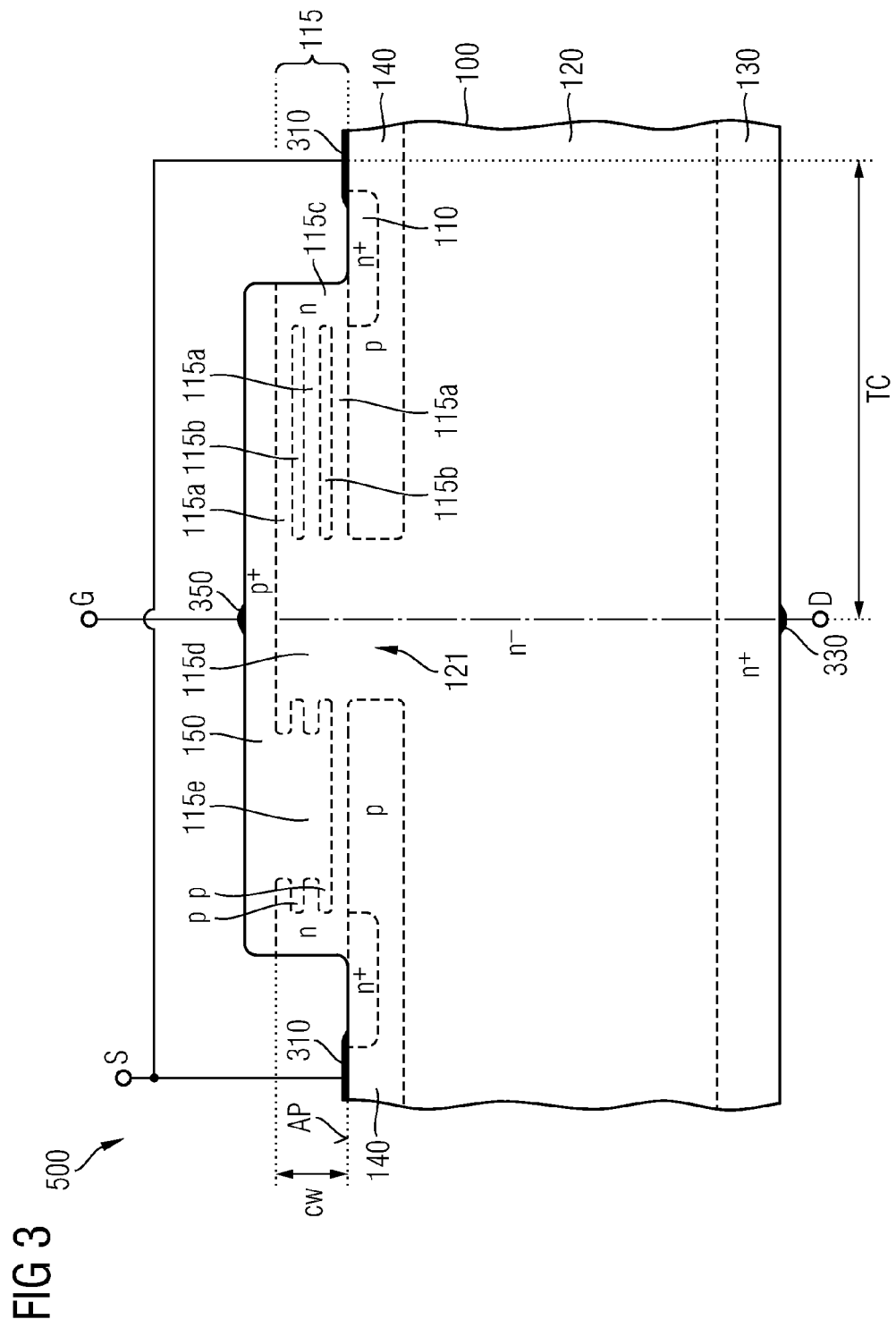
FIG. 3 is a schematic cross-sectional view of a portion of a semiconductor device including a JFET cell according to an embodiment providing a lateral channel region with vertically connected horizontal counter-doped layers.

The semiconductor device 500 of FIG. 3 includes JFET cells TC with a third connection zone 115e structurally and electrically connecting the second zones 115b with the top gate region 150. The third connection zone 115e may be a vertical column formed by two further implants of the p-type with ion implantation energy levels between the ion implantation energy levels of the upper and the lower second zone 115b and between the upper second zone 115b and the top gate region 150. The third connection zone 115e may be formed locally such that it does not completely surround the second connection zone 115d in the vertical projection of the vertical channel region 121. In case of stripe-shaped JFET cells TC, the third connection zone 115e may be formed only in sections along a longitudinal axis perpendicular to the cross-sectional plane. In case of rotational-symmetric mesas of the JFET cells TC, the third connection zone 115e may be formed only in one or more segments. According to another embodiment, the third connection zone 115e may be connected to the buried gate region 140 instead of the top gate region 150.

FIGS. 4A to 4E refer to a method of manufacturing semiconductor devices with JFET cells TC from a semiconductor substrate 500a.

A first epitaxial layer 120a from a single-crystalline semiconductor material is grown by epitaxy on a single-crystalline pedestal layer 130a of a first conductivity type, wherein the crystal lattice of the first epitaxial layer 120a grows in registry with the crystal lattice of the pedestal layer 130a. The single-crystalline semiconductor material of the first epitaxial layer 120a may have a band gap of 2.0 eV or greater, such as gallium nitride (GaN) or silicon carbide (SiC). According to an embodiment, the single-crystalline semiconductor material is silicon carbide (SiC), for example 2H—SiC, 4H—SiC, 6H—SiC or 15R—SiC. The semiconductor material of the pedestal layer 130a may be the same or another semiconductor material. The first epitaxial layer 120a may be in-situ doped with impurities of the first conductivity type during the expitaxy.

According to the illustrated embodiments, the first conductivity type is n-type and the second, opposite conductivity type is p-type. Similar considerations apply for embodiments with the first conductivity type being p-type and the second conductivity type being n-type.

A channel layer 115x is formed by epitaxy on a process surface PS of the first epitaxial layer 120a opposite to the pedestal layer 130a. The channel layer 115x may be in-situ doped with the conductivity type of the first epitaxial layer 120a.

Figure 4A:
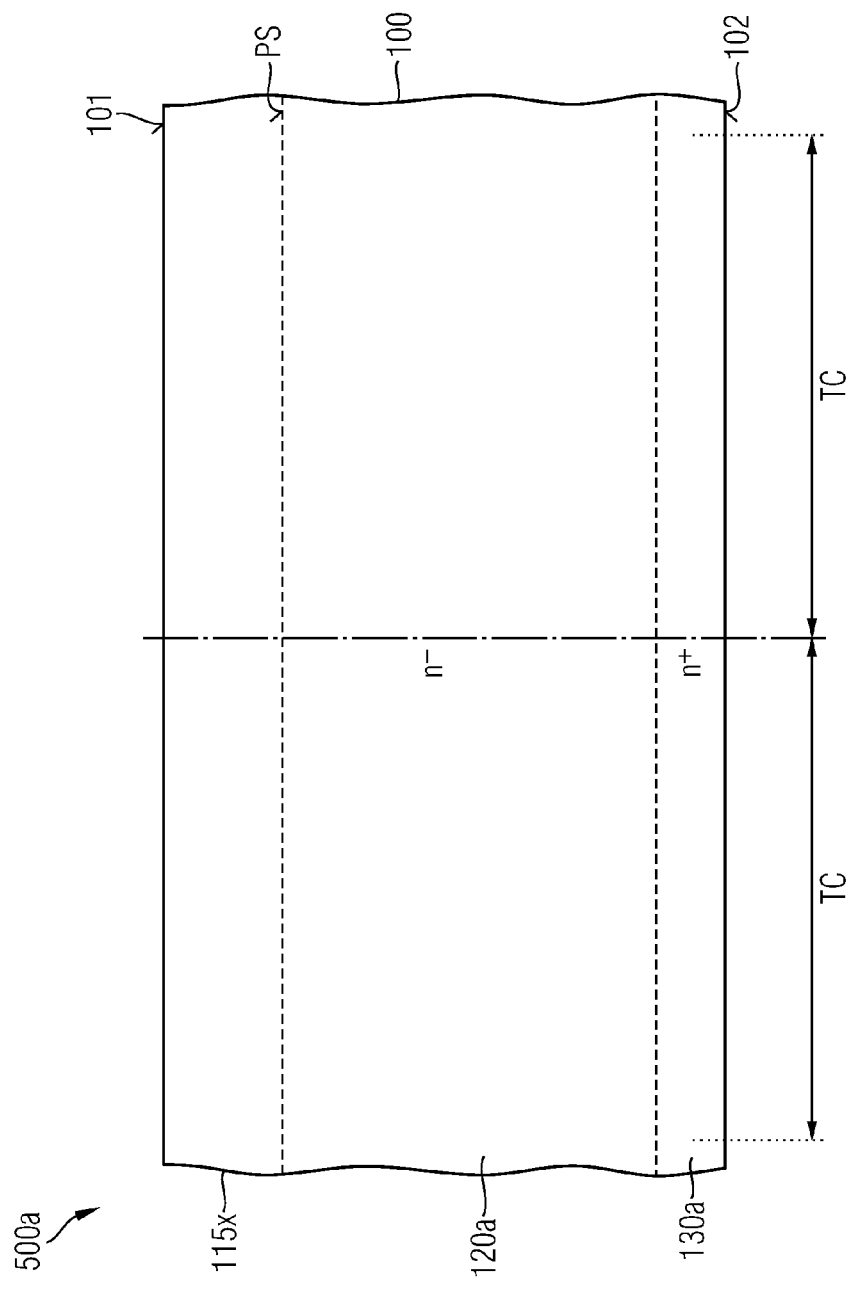
FIG. 4A is a schematic cross-sectional view of a portion of a semiconductor substrate for illustrating an embodiment of a method of manufacturing a semiconductor device with a JFET cell including a lateral channel region after forming a channel layer.

FIG. 4A shows the semiconductor substrate 500a with the first epitaxial layer 120a formed on the pedestal layer 130a. The channel layer 115x is formed on the process surface PS of the first epitaxial layer 120a. A mean impurity concentration in the channel layer 115x may be at least ten times as high as the mean impurity concentration in the first epitaxial layer 120a.

A first mask layer is deposited on a first surface 101 of a semiconductor body 100 formed by the pedestal layer 130a, the first epitaxial layer 120a and the channel layer 115x. The first mask layer is patterned by photolithography to obtain a first implant mask 401 with openings exposing first sections of the first surface 101 and covering second sections of the first surface 101. Impurities of the second conductivity type, which is opposite to the conductivity type of the epitaxial layer 120a and the channel layer 115x, are implanted through the openings of the first implant mask 401. In combination with suitable annealing and diffusion processes the implant results in buried p-type wells with a thickness bgd at a distance d2 to the first surface 101.

FIG. 4B shows the buried p-type wells forming buried gate regions 140 at the distance d2 to the first surface 101 in portions of the semiconductor body 100 exposed by the first implant mask 401. The buried gate regions 140 may be formed completely in the channel layer 115x between the first surface 101 and the process surface PS, completely in the first epitaxial layer 120a between the process surface PS and the second surface 102 or may be formed in parts in the channel layer 115x and in parts in the first epitaxial layer 120a. Portions of the semiconductor body 100 covered by portions of the first implant mask 401 may form vertical channel regions 121 of the first conductivity type.

A second implant mask 402 may be formed on the first surface 101. For example, the first implant mask 401 of FIG. 4B may be removed and a second mask layer may be deposited and patterned by photolithography to form the second implant mask 402. According to another embodiment, the first implant mask 401 may be maintained and amended by spacer portions 402a extending along vertical sidewalls of portions of the first implant mask 401. For example, a conformal second mask layer may be deposited that covers the first implant mask 401 and the first sections of the first surface 101 exposed by the first implant mask 401. The conformal second mask layer may be patterned by an anisotropic etch that removes horizontal portions of the second mask layer above the first implant mask 401 and on the first surface 101.

Impurities of the first conductivity type may be implanted through openings in the second implant mask 402 to form in combination with suitable annealing and diffusion processes at least one source region 110 per JFET cell TC. The implant may be performed at an implant energy resulting in an n-type well that extends into the buried gate regions 140 at the distance d2 to the first surface 101.

According to another embodiment, at first the second mask 402 is formed and used to form the source regions 110, then the first mask 401 for forming the buried gate regions 140 is obtained from the second mask 402 by an isotropic recess.

Figure 4C:
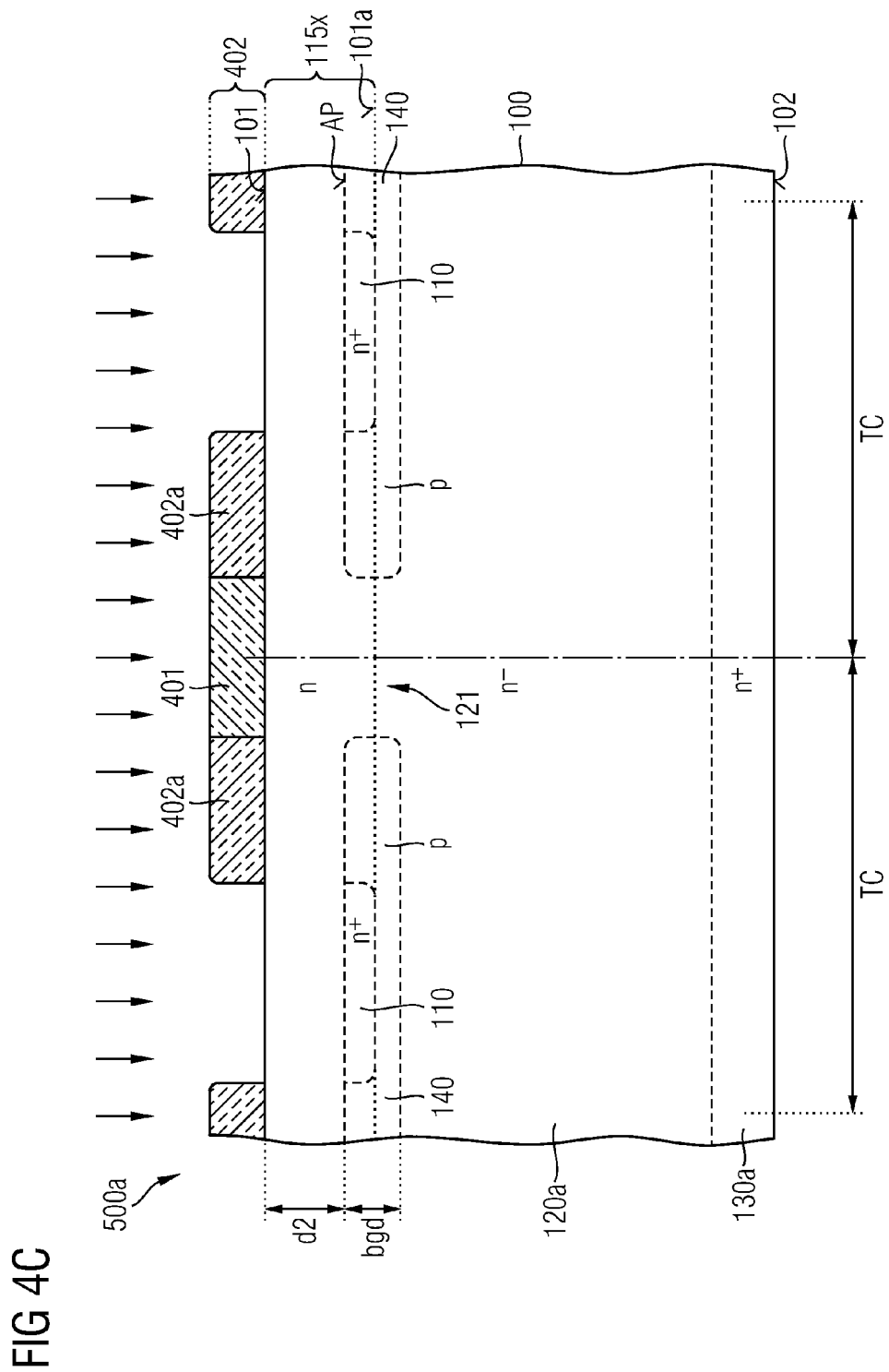
FIG. 4C is a schematic cross-sectional view of the semiconductor substrate portion of FIG. 4B after forming source regions.

FIG. 4C shows the second implant mask 402 including the first implant mask 401 and spacer portions 402a. The second implant mask 402 exposes portions of the buried gate regions 140 spaced from the vertical channel region 121. The source regions 110 are formed as wells extending from an auxiliary plane AP defined as a plane of the pn junction between the buried gate regions 140 and the lateral channel regions into the buried gate regions 140, wherein a vertical extension of the source regions 110 is smaller than the vertical extension bgd of the buried gate regions 140. The second implant mask 402 is removed and impurities of the first conductivity type are implanted into the first surface 101 at an implant energy resulting in a p-type well that extends from the first surface 101 into the channel layer 115x.

Figure 4D:
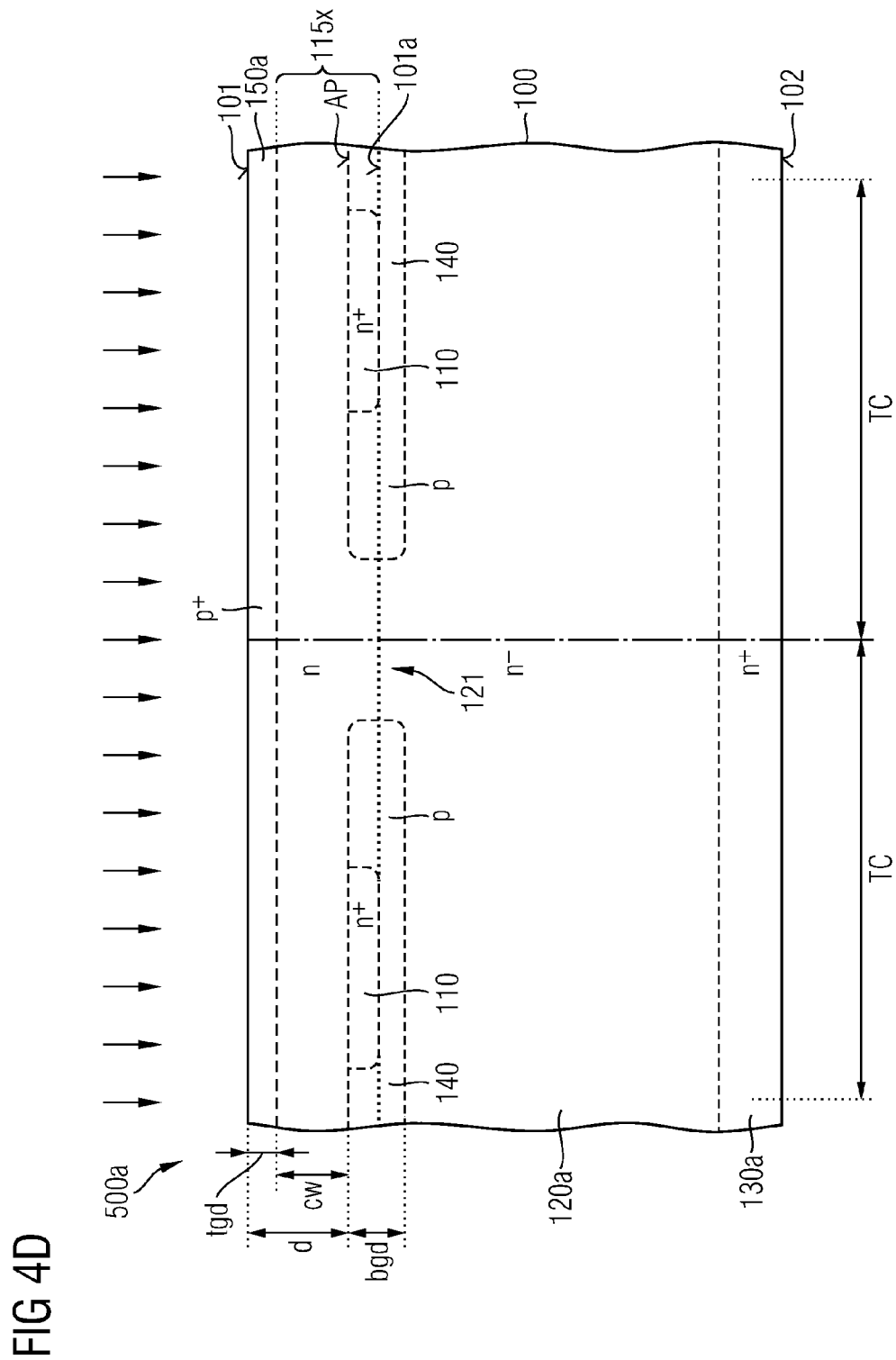
FIG. 4D is a schematic cross-sectional view of the semiconductor substrate portion of FIG. 4C after forming a top gate region.

FIG. 4D shows the resulting p-type well forming a top gate layer 150a directly adjoining the first surface 101 and having a thickness tgd.

Both the top gate layer 150a and the buried gate regions 140 result from implant processes whose doses and energies can be precisely controlled. As a result, a channel width cw between the top gate layer 150a and an upper edge of the buried gate regions 140 oriented to the first surface 101 is well-defined.

An etch mask may be provided that covers third sections of the first surface 101 in a vertical projection of the vertical channel region 121, in a vertical projection of the portion of the buried gate region 140 between the vertical channel region 121 and the source region 110, and in a vertical projection of a portion of the source region 110 oriented to the vertical channel region 121. The etch mask exposes fourth sections of the first surface 101 in the vertical projection of a further portion of the source region 110 averted from the vertical channel region 121 and in the vertical projection of the buried gate region 140 averted from the vertical channel region 121. An anisotropic etch may be performed using the etch mask to expose portions of the source regions 110 and the buried gate regions 140 which directly adjoin to each other.

Figure 4E:
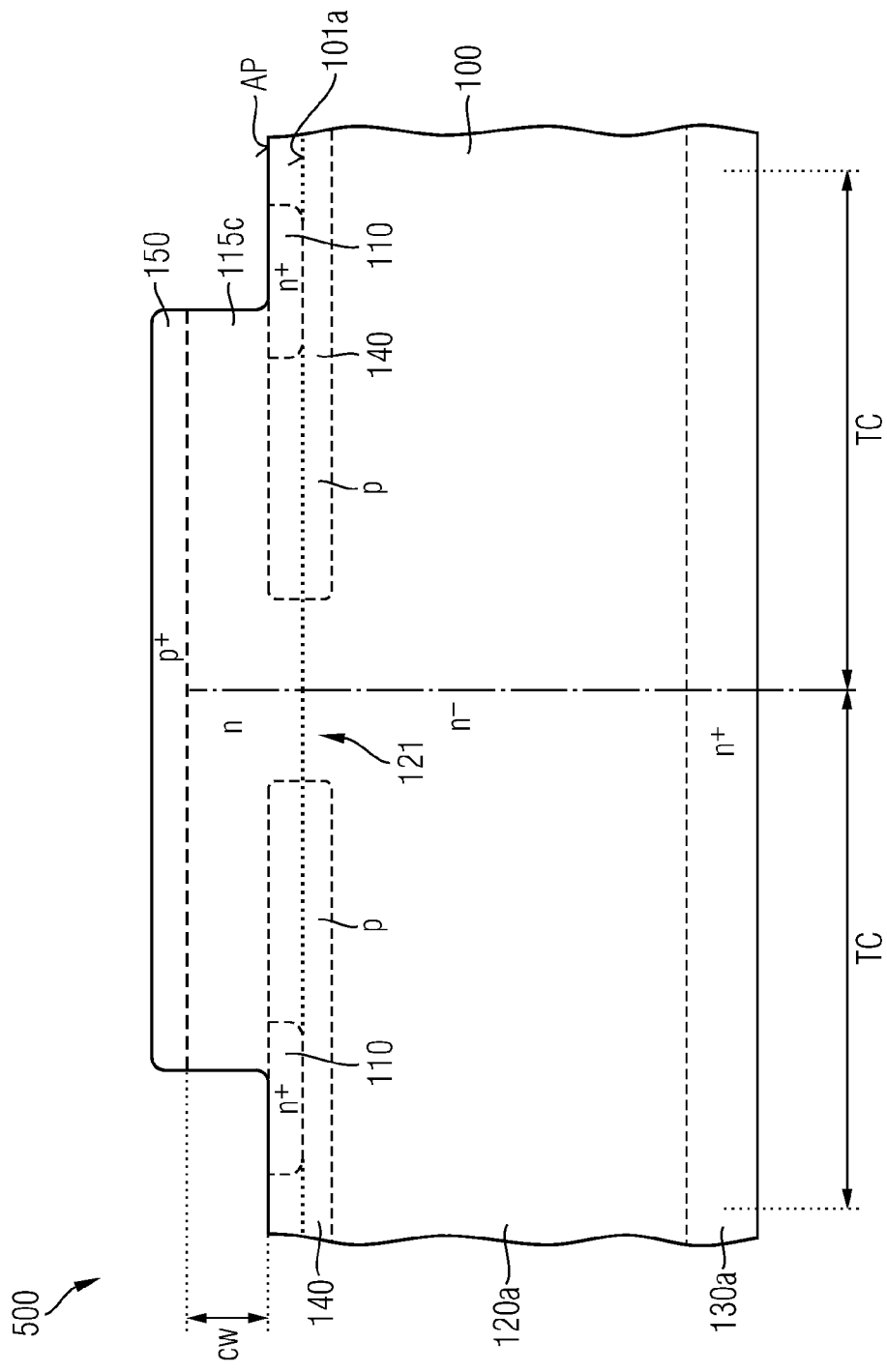
FIG. 4E is a schematic cross-sectional view of the semiconductor substrate portion of FIG. 4D after exposing the source and buried gate regions.

FIG. 4E shows a mesa including a top gate region 150 and two lateral channel regions 115 of two JFET cells TC, formed from portions of the top gate layer 150a and the channel layer 115x of FIG. 4D, respectively. The top gate, source and buried gate regions 150, 110, 140 are exposed and accessible for the formation of ohmic contacts. The pedestal layer 130a includes the drain layer of semiconductor devices obtained from the semiconductor substrate 500a.

The non-implanted portion of the first epitaxial layer 120a forms drift zones 120 of JFET cells TC of singularized semiconductor devices obtained from the semiconductor substrate 500a.

Figure 5A:
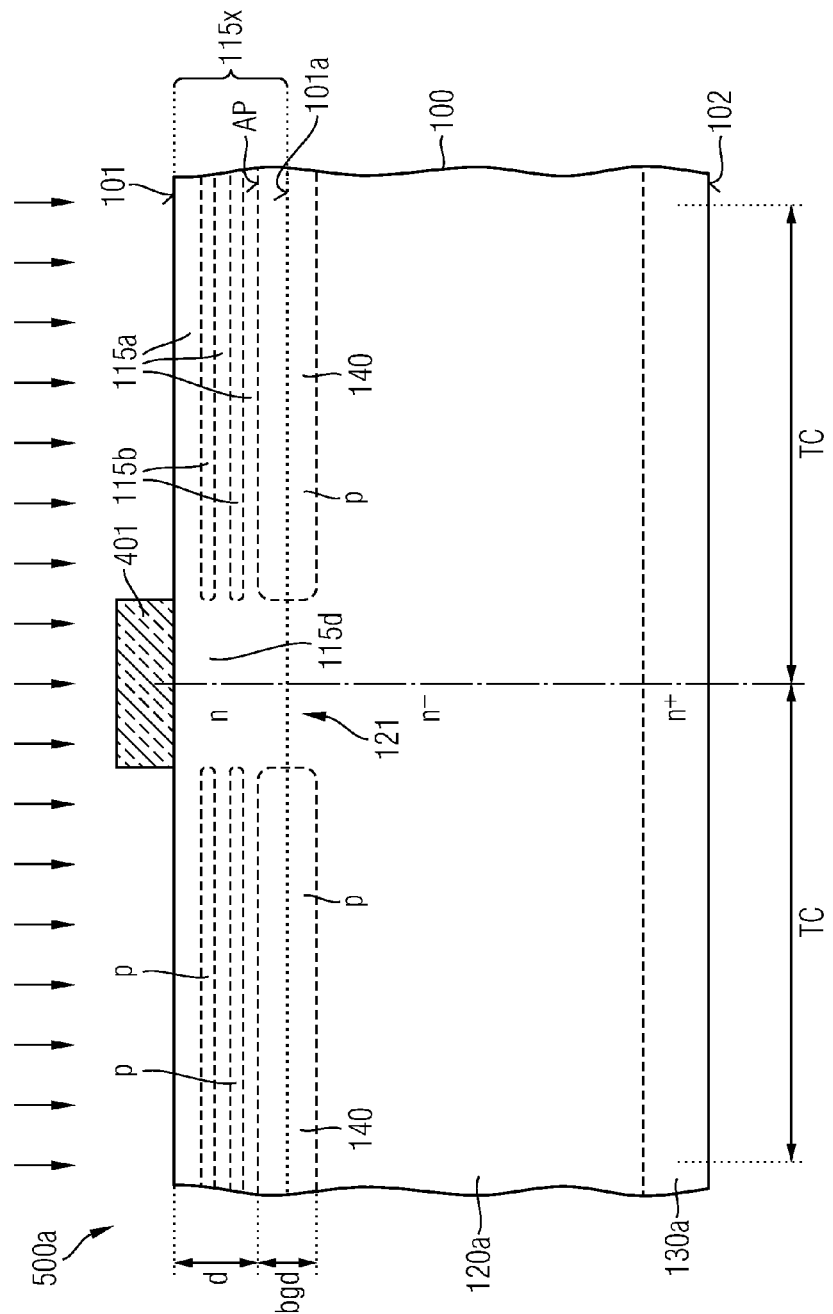
FIG. 5A is a schematic cross-sectional view of a portion of a semiconductor substrate for illustrating another embodiment of a method of manufacturing a semiconductor device with a JFET cell including a lateral channel region with a horizontal super junction structure after forming counter-doped zones in the lateral channel region.
Figure 5B:
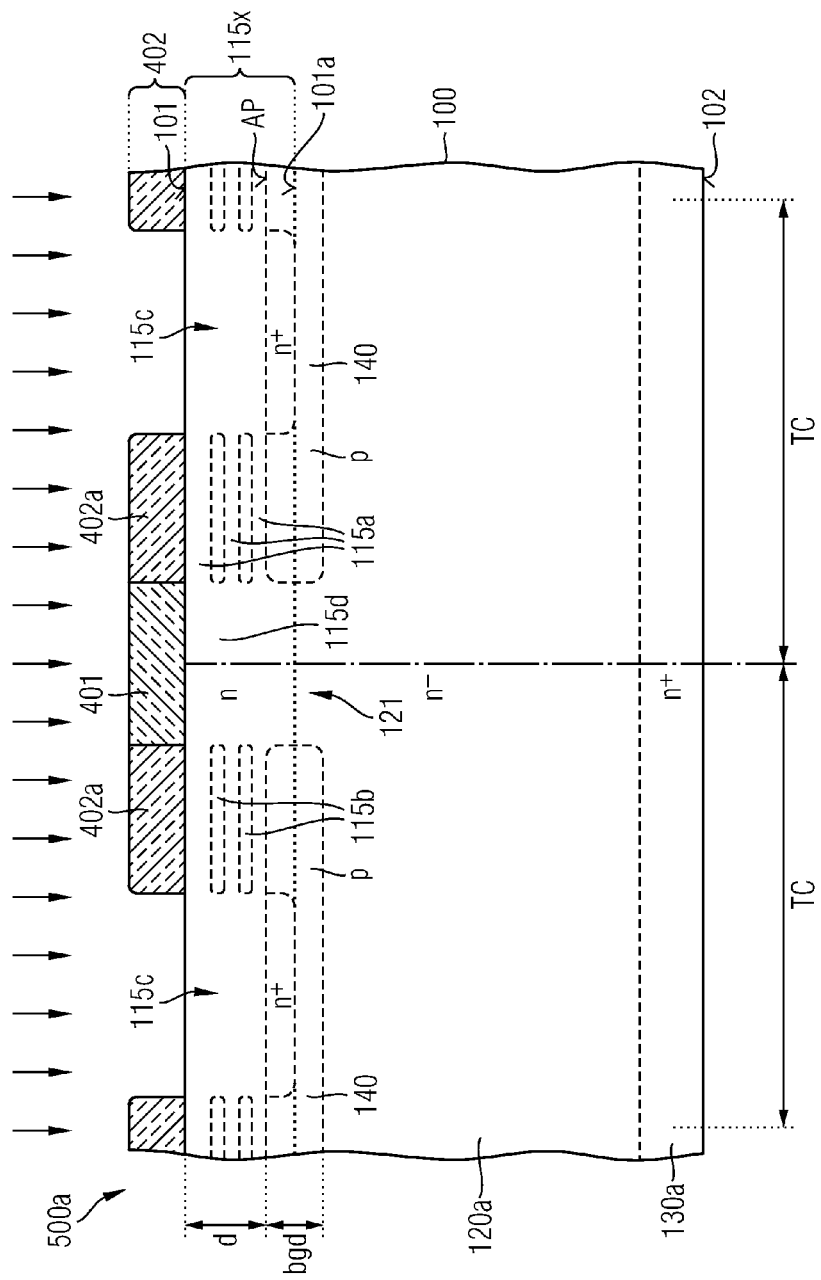
FIG. 5B is a schematic cross-sectional view of the semiconductor substrate portion of FIG. 5A after forming the source regions and a first vertical connection zone in the lateral channel region.
Figure 5C:
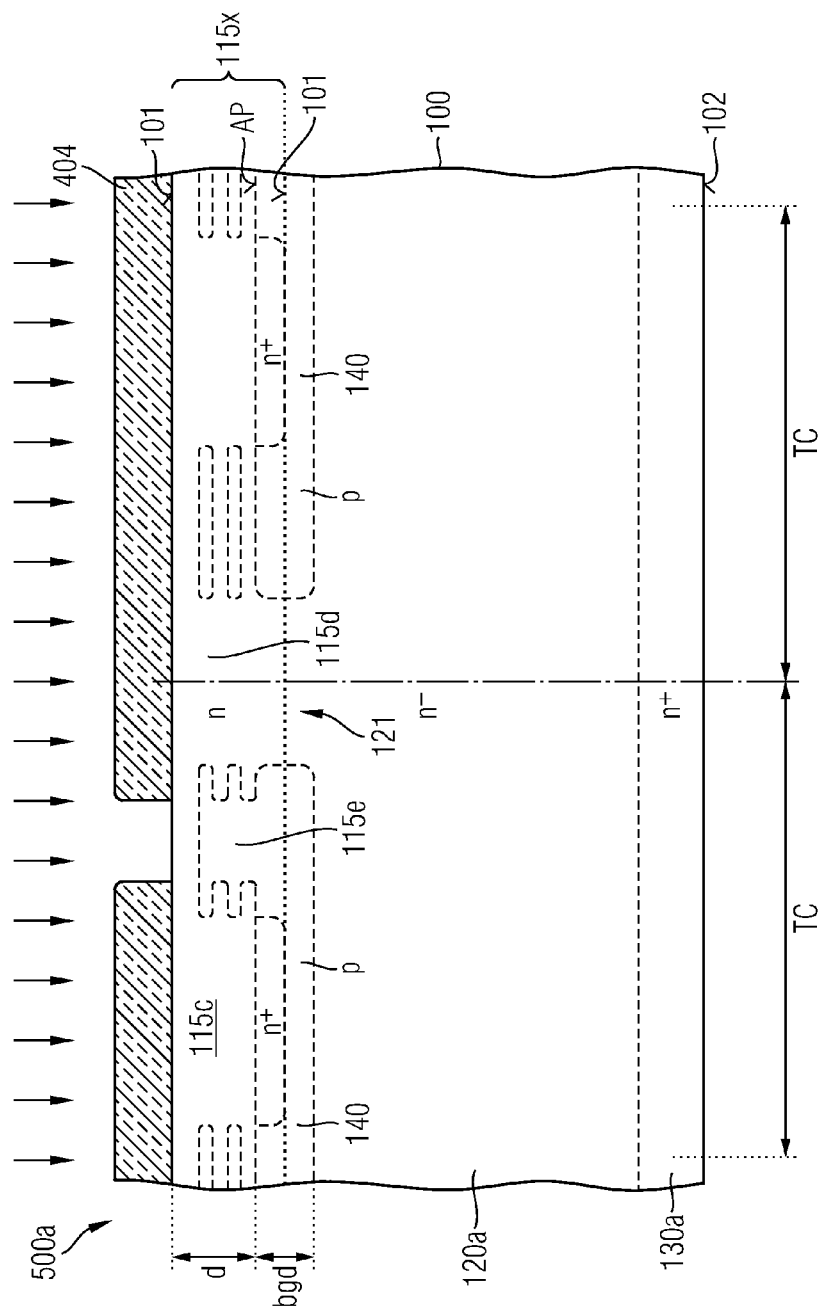
FIG. 5C is a schematic cross-sectional view of the semiconductor substrate portion of FIG. 5B after forming a second vertical connection zone in the lateral channel region.

FIGS. 5A to 5C refer to an embodiment of a method of manufacturing semiconductor devices with a horizontal super junction structure in a channel layer 115x.

A semiconductor substrate 500a may be provided as discussed in detail with regard to FIGS. 4A and 4B.

The first implant mask 401 of FIG. 4B may be used not only for the formation of the buried gate regions 140 but also for the formation of second doped zones 115b in the channel layer 115x between the first surface 101 and the auxiliary plane AP. The implants are performed at different implant energies such that second zones 115b of the p-type are formed at a distance to each other and to the first surface 101 and the auxiliary plane AP. According to an embodiment, the second zones 115b may be formed such that the second zones 115b have approximately the same thickness and are approximately equally spaced from each other. Portions of the channel layer 115x outside the second zones 115b may form first zones 115a.

According to other embodiments, the implants for the formation of the second zones 115b are performed in absence of an implant mask such that the first and second zones 115a, 115b may form contiguous layers, respectively. Another embodiment may provide an amended first implant mask 401 covering further sections at a side of the JFET cells TC averted from the vertical channel region 121 such that no second zones 115b are formed in a contiguous vertical n-type column connecting the first zones 115a above a source region 110, which may be formed in the following. Further embodiments may provide additional implants of impurities of the n-type to strengthen the impurity concentrations in the first zones 115a and/or to define the impurity concentrations in the first zones 115a more precisely.

Further embodiments may provide a growth of the channel layer 115x by steps wherein after each growth step impurities are implanted to form the first and second zones 115a, 115b.

FIG. 5A shows second zones 115b formed in the vertical projection of the buried gate regions 140. In the vertical projection of the vertical channel region 121 a second connection zone 115d structurally and electrically connects the first zones 115a of the super junction structure in the channel layer 115x.

A second implant mask may be provided and used to form source regions 110 extending from the auxiliary plane AP into the buried gate regions 140 as described in detail with reference to FIG. 4C. In addition, the second implant mask 402 may be used to form the first conductive zones 115c in the channel layer 115x in the vertical projection of the source zones 110.

FIG. 5B shows the source regions 110 and first connection zones 115c in the vertical projection of the source regions 110. The first connection structures 115c structurally and electrically connect the first zones 115a of the super junction structure in the channel layer 115x in the vertical projection of the source regions 110.

A further implant mask 404 may be provided that locally exposes portions of the channel layer 115x in the vertical projection of second zones 115b between the source zones 110 and the vertical channel region 121. The third implant mask 404 covers the first surface 101 in the remaining region of the JFET cell TC. Impurities of the second conductivity type may be implanted through the openings of the third implant mask 404 at implant levels between the implant levels of neighboring second zones 115b and at an implant level between that of the buried gate region 140 and that of the second zone 115b neighboring the buried gate region 140 or, alternatively, at an implant level between that of the first surface 101 and the second zone 115b closest to the first surface 101.

FIG. 5C shows the third implant mask 404 and a third connection zone 115e of the second conductivity type. The third connection zone 115e may be patterned along a lateral direction perpendicular to the cross-sectional plane and may connect all second zones 115b with each other and with either the buried gate region 140 or the top gate region 150. According to other embodiments, each of the first, second and third connection zones 115c, 115d, 115e may be formed by etching a trench and filling the trench with material of the p-type or the n-type, or introducing impurities through side walls of the concerned trench by tilted implants or plasma deposition.

Figure 6A:
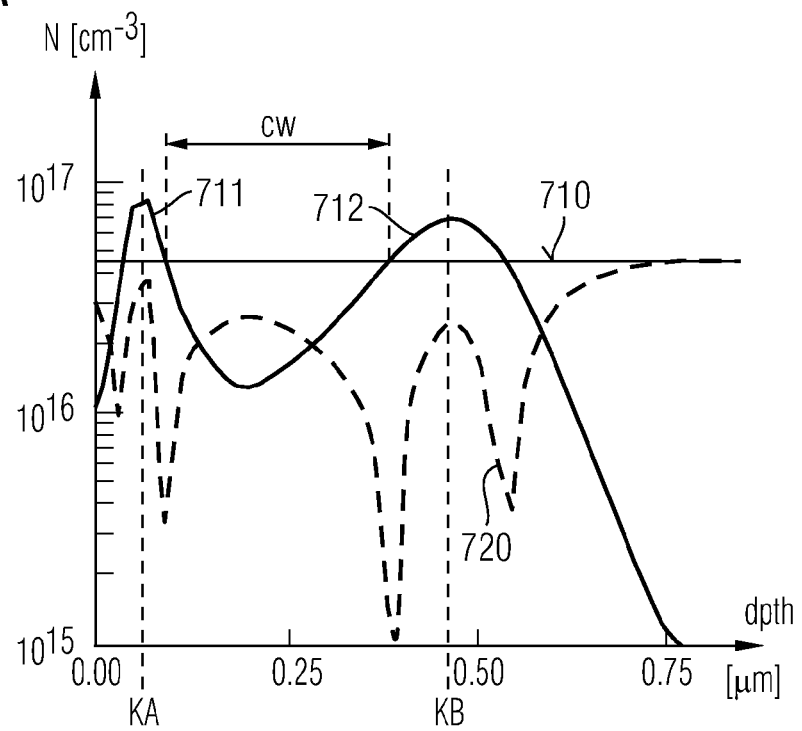
FIG. 6A is a schematic diagram illustrating a vertical impurity profile of a lateral channel region of a semiconductor device according to an embodiment defining a width of the lateral channel region by a difference in implant energies.

FIG. 6A refers to a vertical impurity concentration profile of a lateral channel region of a semiconductor device according to an embodiment defining an effective channel width by implant energies. An n-type impurity concentration 710 results from a background doping and may be constant at least in a portion of the semiconductor body in which the lateral channel region is formed. P-type impurities are implanted at least two different implant energy levels corresponding to implant depths KA and KB.

The implants result in impurity profiles 711, 712 with peak portions centered around KA and KB, wherein at least the peak portion of the impurity profile 712 is Gaussian-like with the maximum concentration in or close to the middle of the buried gate region. In regions around KA and KB the implanted impurities over-compensate the background impurity concentration 710. A region within the interval between KA and KB which is not counter-doped by the implants at KA and KB defines the n-type lateral channel and the channel width cw. Since both implants at KA and KB are performed through the same surface without epitaxial growth between the two implants, the effective channel width cw is exclusively defined by the implant energies and implant doses which can be reliably and precisely controlled. Implant profile 720 shows the resulting net impurity profile.

Figure 6B:
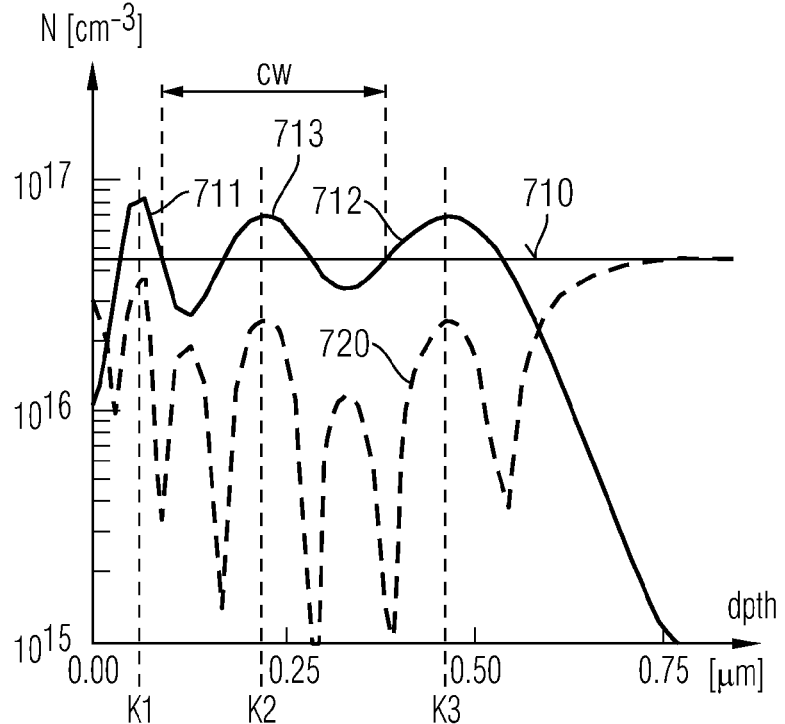
FIG. 6B is a schematic diagram illustrating another embodiment of a vertical impurity profile of a lateral channel region of a semiconductor device comprising a super junction structure with one horizontal p-type zone.

FIG. 6B illustrates a vertical impurity profile of a lateral channel region of a semiconductor device 500 as illustrated in FIG. 1. The lateral channel region is grown by epitaxy with a uniform and homogenous impurity concentration resulting in a constant n-type impurity profile 710. The n-type impurities may be nitrogen atoms/ions. P-type impurities are implanted at three different energy levels corresponding to implant depths K1, K2, K3 and implant impurity profiles 711, 712, 713. The p-type impurities may be aluminum atoms/ions. The implant doses are selected such that p-type impurities over-compensate the n-type impurities in zones around the implant depths K1, K2, K3 and do not over-compensate the background impurity concentration in remaining regions within each of the intervals between 0 and K1, K1 and K2, K2 and K3, and beyond k3, respectively. The implant depth K1 may correspond to the top gate region 150 of FIG. 1, the implant depth K2 may correspond to the p-type second zone 115b of FIG. 1, and the implant depth K3 may correspond to the buried gate region 140 of FIG. 1. Implant profile 720 shows the resulting net impurity profile.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
    a junction field effect transistor cell comprising a top gate region, a lateral channel region and a buried e region electrically separated from the top gate region,
    wherein the lateral channel region is arranged between the top gate region and the buried gate region along a vertical direction with respect to a first surface of a semiconductor body,
    wherein the lateral channel region comprises at least two first zones of a first conductivity type and at least one second zone of a second conductivity type, the first and second zones alternating along the vertical direction, and
    wherein, in the lateral channel region, a first connection zone of the first conductivity type in the vertical projection of a source region structurally connects the first zones and the source region, and in the vertical projection of a vertical channel region a second connection zone structurally connects the first zones, and the at least one second zone extends from the first connection zone to the second connection zone, and wherein the at least one second zone floats.

2. The semiconductor device of claim 1, wherein
    pn junctions between the first and second zones are parallel to the first surface.

3. The semiconductor device of claim 1, wherein:
    the source region is between the lateral channel region and the buried gate region.

4. The semiconductor device of claim 1, further comprising:
    a drift zone of the first conductive type, wherein the drift zone comprises the vertical channel region directly adjoining the lateral channel region.

5. The semiconductor device of claim 4, wherein
    the buried gate region is between the lateral channel region and the drift zone.

6. The semiconductor device of claim 4, further comprising:
    a drain layer of the first conductivity type directly adjoining the drift zone, wherein the drift zone separates the lateral channel region and the buried gate region from the drain layer.

7. The semiconductor device of claim 1, wherein
    the at least one second zone has a vertical extension in the range from 30 nm to 500 nm.

8. The semiconductor device of claim 1, wherein
    the semiconductor body is based on silicon carbide.

9. The semiconductor device of claim 1, wherein
    vertical extensions and impurity concentrations of the first and second zones are selected such that the semiconductor device is configured as normally-off semiconductor device.

10. A semiconductor device comprising:
    a junction field effect transistor cell comprising a top gate region, a lateral channel region and a buried gate region electrically separated from the top gate region,
    wherein the lateral channel region is arranged between the top gate region and the buried gate region along a vertical direction with respect to a first surface of a semiconductor body, and wherein the lateral channel region comprises at least three first zones of a first conductivity type and at least two or more second zones of a second conductivity type, the first and second zones alternating along the vertical direction, wherein in the lateral channel region a first connection zone of the first conductivity type in the vertical projection of a source region structurally connects the first zones and the source region, and in the vertical projection of a vertical channel region a second connection zone structurally connects the first zones, and the at least one second zone extends from the first connection zone to the second connection zone, and wherein at least one third connection zone that is electrically separated from the top gate region and that is formed asymmetrically with respect to the second connection zone electrically connects the at least one second zone to the buried gate region.

11. A semiconductor device comprising:

a junction field effect transistor cell comprising a top gate region, a lateral channel region and a buried gate region electrically separated from the top gate region, wherein the lateral channel region is arranged between the top gate region and the buried gate region along a vertical direction with respect to a first surface of a semiconductor body, wherein the lateral channel region comprises at least two first zones of a first conductivity type and at least one second zone of a second conductivity type, the first and second zones alternating along the vertical direction, and wherein at least one third connection zone that is electrically separated from the top gate region and that is formed asymmetrically with respect to the second connection zone, wherein in the lateral channel region a first connection zone of the first conductivity type in the vertical projection of a source region structurally connects the first zones and the source region, and in the vertical projection of a vertical channel region a second connection zone structurally connects the first zones, and wherein vertical extensions and impurity concentrations of the first and second zones are selected such that the semiconductor device is configured as normally-off semiconductor device.

* * * * *

UNITED STATES PATENT AND TRADEMARK OFFICE
CERTIFICATE OF CORRECTION

PATENT NO. : 9,548,399 B2
APPLICATION NO. : 14/082815
DATED : January 17, 2017
INVENTOR(S) : Konrath et al.

Page 1 of 1

It is certified that error appears in the above-identified patent and that said Letters Patent is hereby corrected as shown below:

In the Claims

Column 12, Line 9, Claim 1, Line 3, change "e" to -- gate --

Column 12, Line 29, Claim 1, Line 22, change "the at least one second zone floats." to
-- at least one third connection zone that is separated from the top gate region and that is formed asymmetrically with respect to the second connection zone electrically connects the at least one second zone to the buried gate region. --

Signed and Sealed this
Eighteenth Day of April, 2017

Michelle K. Lee
*Director of the United States Patent and Trademark Office*